United States Patent
Uchiyama

(10) Patent No.: US 8,288,042 B2
(45) Date of Patent: Oct. 16, 2012

(54) ELECTRIC POWER GENERATION DEVICE

(75) Inventor: Naoki Uchiyama, Hamamatsu (JP)

(73) Assignee: Kabushiki Kaisha Atsumitec, Hamamatsu-Shi (JP)

(*) Notice: Subject to any disclaimer, the term of this patent is extended or adjusted under 35 U.S.C. 154(b) by 1093 days.

(21) Appl. No.: 12/224,148

(22) PCT Filed: Feb. 15, 2007

(86) PCT No.: PCT/JP2007/052754
§ 371 (c)(1),
(2), (4) Date: Aug. 19, 2008

(87) PCT Pub. No.: WO2007/105403
PCT Pub. Date: Sep. 20, 2007

(65) Prior Publication Data
US 2009/0087691 A1    Apr. 2, 2009

(30) Foreign Application Priority Data

Feb. 27, 2006 (JP) .................. 2006-050121

(51) Int. Cl.
*H01M 8/18* (2006.01)
(52) U.S. Cl. ............... 429/419; 429/7; 429/9; 429/405; 429/436; 429/479
(58) Field of Classification Search .......... 429/405, 429/419, 479, 481, 7, 9
See application file for complete search history.

(56) References Cited

U.S. PATENT DOCUMENTS

| | | | |
|---|---|---|---|
| 2006/0157102 A1* | 7/2006 | Nakajima et al. | 136/205 |
| 2006/0216559 A1* | 9/2006 | Olivier et al. | 429/26 |
| 2006/0266402 A1* | 11/2006 | Zhang et al. | 136/205 |

FOREIGN PATENT DOCUMENTS

| | | |
|---|---|---|
| JP | 04-280073 A | 10/1992 |
| JP | 09-289030 A | 11/1997 |
| JP | 2000-173640 A | 6/2000 |
| JP | 2001-028805 A | 1/2001 |
| JP | 2002-141077 A | 5/2002 |
| JP | 2002-280015 A | 9/2002 |
| JP | 2002-280017 A | 9/2002 |
| JP | 2002-313357 A | 10/2002 |
| JP | 2006-147400 A | 6/2006 |
| WO | WO 2005/004263 A2 * | 1/2005 |

OTHER PUBLICATIONS

"Fuel Cell Technologies"; First Edition, Third Impression; pp. 183-230; Special Committee on Technological Investigation of Next-generation Systems for Electricity Generation by Fuel Cells, Institute of Electrical Engineers, Japan; Ohmsha, Ltd.; Jan. 15, 2005.

* cited by examiner

*Primary Examiner* — Patrick Joseph Ryan
*Assistant Examiner* — Ben Lewis
(74) *Attorney, Agent, or Firm* — Holtz, Holtz, Goodman & Chick, P.C.

(57) ABSTRACT

An electric power generation device includes a cell body and a secondary electric power generator. The cell body has an electrolyte, a fuel electrode and an air electrode. The secondary electric power generator is joined to at least one of the fuel and air electrodes and includes P- and N-type thermoelectric conversion members. With the electric power generation device, the cell body generates electric power at temperatures higher than or equal to an power generation start temperature, and at the same time, the P- and N-type thermoelectric conversion members joined to the cell body and functioning as a thermocouple produce electric power by utilizing the Seebeck effect.

2 Claims, 4 Drawing Sheets

ELECTRIC POWER GENERATION DEVICE

This application is a U.S. National Phase Application under 35 USC 371 of International Application PCT/JP2007/052754 filed Sep. 20, 2007.

TECHNICAL FIELD

The present invention relates to an electric power generation device capable of efficiently using thermal energy for operating a fuel cell.

BACKGROUND ART

Hydrogen fuel cells have been attracting attention as an energy source capable of restraining emission of carbon dioxide. A hydrogen fuel cell has a fuel cell body (cell body) comprising fuel and air electrodes joined to an electrolyte, and with the temperature of the cell body kept at a predetermined power generation start temperature or above by heat applied, for example, from an external heater, a fuel gas is supplied to the cell body, whereby electric power is generated.

The cell body of a solid oxide fuel cell (SOFC) comprises an electrolyte of solid oxide, and a fuel electrode (hydrogen electrode) and an air electrode (oxygen electrode) both joined to (formed on) the solid oxide electrolyte. In the solid oxide fuel cell, the cell body is fed with a fuel gas and air, whereupon electric power is generated.

The solid oxide fuel cell is known to have a variety of advantages, as set forth in "Fuel Cell Technologies", First Edition, Third Impression, pp. 183-230, by the Special Committee on Technological Investigation of Next-generation Systems for Electricity Generation by Fuel Cells, the Institute of Electrical Engineers of Japan, published from Ohmsha, Ltd. on Jan. 5, 2005 (hereinafter referred to as Document 1).

Specifically, with the solid oxide fuel cell, high output is available, and besides, not only hydrogen gas but gases containing large quantities of carbon monoxide can be used as fuel. Also, since the solid oxide fuel cell operates at high temperatures, it is unnecessary to use an expensive platinum catalyst and the internal reforming can be utilized. Further, hydrogen or carbon monoxide required for the cell reaction can be produced from the fuel, such as methane, by making use of heat generated by the cell body, and thus, the device equipped with the solid oxide fuel cell can be reduced in size and improved in efficiency.

It has been known from Document 1 and other publications that a dual-chamber-type solid oxide fuel cell is a common type in which the fuel and air electrodes are isolated from each other by a separator and are respectively supplied with a fuel gas and air or the like.

A single-chamber-type solid oxide fuel cell is also known wherein the fuel and air electrodes are not isolated by a separator and electric power is generated with the cell body placed in an atmosphere containing the mixture of a fuel gas, such as hydrogen or methane, and air or the like.

Such single-chamber-type solid oxide fuel cells are disclosed, for example, in Unexamined Japanese Patent Publications No. 2002-280015, No. 2002-280017, and No. 2002-313357.

Fuel cells are associated, however, with the problem of energy loss accompanying release of thermal energy. Especially in the case of solid oxide fuel cells that operate (generate electricity) in high-temperature environments, the electric power generation efficiency is considerably low. Also, it is very often the case that the heat of reaction (thermal energy) generated at the fuel and air electrodes is not effectively utilized but emitted to outside.

DISCLOSURE OF THE INVENTION

The present invention was made to solve the above problems, and an object thereof is to provide an electric power generation device capable of effectively utilizing the thermal energy for operating a fuel cell and, preferably, the heat of reaction, thereby achieving high electric power generation efficiency.

To achieve the object, an aspect of the present invention is directed to provide an electric power generation device comprising a cell body having an electrolyte, a fuel electrode and an air electrode; and secondary electric power generation means joined to at least one of the fuel electrode and the air electrode, and including a P-type thermoelectric conversion member and an N-type thermoelectric conversion member.

With the electric power generation device, the cell body generates electric power in a high-temperature environment, and in addition, the secondary electric power generation means, namely, the P- and N-type thermoelectric conversion members joined to the high-temperature cell body and constituting a thermocouple produce electric power by making use of the Seebeck effect. Accordingly, the electric power generation efficiency can be improved.

Further, the heat of reaction generated at the fuel or air electrode to which the P- and N-type thermoelectric conversion members are joined is also converted into electric power by the Seebeck effect, making it possible to attain higher electric power generation efficiency.

The N-type thermoelectric conversion member may be joined to the fuel electrode of the cell body, and the P-type thermoelectric conversion member may be joined to the air electrode of the cell body.

With this arrangement, the heat of reaction generated at the fuel and air electrodes can be efficiently transferred to the secondary electric power generation means with no insulating layer therebetween, and accordingly, the efficiency of electric power generation by the Seebeck effect is further enhanced.

Moreover, since the cell body exists between the P- and N-type thermoelectric conversion members serving as a thermocouple, the sum of the voltage generated by the cell body and the voltage generated by the Seebeck effect can be output from the electric power generation device to outside.

The secondary electric power generation means may further include an electrically insulating layer arranged at a junction thereof with the cell body.

In this case, the secondary electric power generation means is electrically insulated from the cell body by the insulating layer. Thus, by connecting the cell body and the secondary electric power generation means suitably in series or parallel with each other, it is possible to derive a desired generation voltage.

The P-type thermoelectric conversion member may be joined to the fuel electrode of the cell body with a first electrically insulating layer therebetween; the N-type thermoelectric conversion member may be joined to the air electrode of the cell body with a second electrically insulating layer therebetween; and the secondary electric power generation means may further include an electrically conducting member electrically connecting between an electrode joined to the P-type thermoelectric conversion member and facing the first electrically insulating layer, and an electrode joined to the N-type thermoelectric conversion member and facing the second electrically insulating layer.

In this case, the heat of reaction generated at the fuel and air electrodes is transferred to the P- and N-type thermoelectric conversion members, respectively, with the result that the efficiency of electric power generation by the Seebeck effect improves.

Alternatively, the N- and P-type thermoelectric conversion members may be arranged at a distance from each other on the electrically insulating layer; and the secondary electric power generation means may further include an electrically conducting member electrically connecting between the respective electrodes of the P- and N-type thermoelectric conversion members facing the electrically insulating layer.

This arrangement permits the cell body and the P- and N-type thermoelectric conversion members to be positioned optimally in high-temperature environments, thus making it possible to further improve the electric power generation efficiency.

In each electric power generation device configured as above, the cell body may constitute part of a solid oxide fuel cell. In this case, the electric power generated by the secondary electric power generation means is added to that generated by the cell body of the solid oxide fuel cell that produces electric power in high-temperature environments, whereby more electric power can be produced with enhanced electric power generation efficiency.

Alternatively, to achieve the above object, an aspect of the present invention is directed to provide an electric power generation device comprising a cell body having an electrolyte, a fuel electrode and an air electrode; and secondary electric power generation means including a P-type thermoelectric conversion member and an N-type thermoelectric conversion member, wherein the P-type thermoelectric conversion member serves as the air electrode of the cell body.

With the electric power generation device constructed in this manner, the P-type thermoelectric conversion member constituting the air electrode directly receives the reaction heat of the air electrode, and thus the efficiency of electric power generation by the Seebeck effect further improves. Also, since the thermoelectric conversion member forms a part of the cell body, the number of elements used in the electric power generation device can be reduced.

It is therefore possible to enhance the electric power generation efficiency of the device while at the same time simplifying the construction of the electric power generation device and lowering costs.

Further, the N-type thermoelectric conversion member may serve as the fuel electrode of the cell body.

In this case, the secondary electric power generation means directly receive the reaction heat of the fuel and air electrodes, and therefore, the efficiency of electric power generation by the Seebeck effect is enhanced even further. Also, since the thermoelectric conversion members are integrated into the cell body, it is possible to further simplify the construction of the electric power generation device and reduce costs. Further, the voltage generated by the cell body and that generated by the secondary electric power generation means can be added together to be output to outside from the electric power generation device.

Thus, in the electric power generation device according to the present invention, the cell body produces electric power, and besides, electric power is generated from the thermal energy that is otherwise emitted to outside as waste heat without being used for electric power generation. Also, the P- and N-type thermoelectric conversion members convert the heat of reaction generated at the fuel and air electrodes of the cell body into electric power by utilizing the Seebeck effect, whereby the efficiency of the electric power generation device using the fuel cell can be further enhanced.

BEST MODE OF CARRYING OUT THE INVENTION

Embodiments of the present invention will be described below with reference to the accompanying drawings.

First Embodiment

An electric power generation device according to a first embodiment of the present invention will be described with reference to FIGS. 1 and 2.

Figure 1:
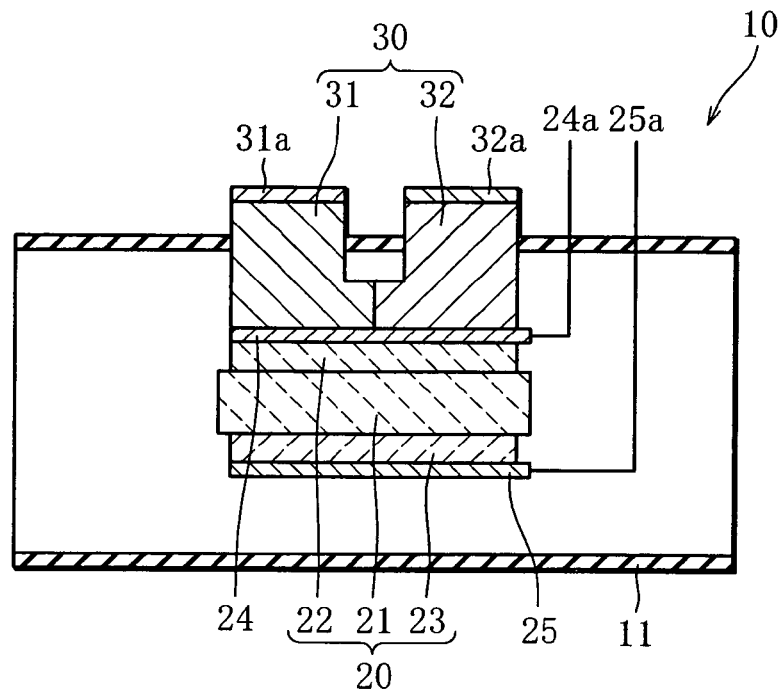
FIG. 1 A schematic sectional view of an electric power generation device according to a first embodiment of the present invention.

FIG. 1 shows, in section, a schematic construction of the electric power generation device according to the first embodiment. The electric power generation device of the first embodiment includes a solid oxide fuel cell (single-chamber type) having a fuel cell body (hereinafter referred to as cell body).

First, the construction of the electric power generation device will be explained.

As shown in FIG. 1, the electric power generation device 10 has a gas conduit 11, a cell body 20, and a secondary electric power generator (secondary electric power generation means) 30. The cell body 20 is located inside the gas conduit 11 and constitutes part of a single-chamber-type solid oxide fuel cell. A mixed fuel gas, which is, for example, a mixture of a fuel gas containing $CH_x$ (hydrocarbon compounds) and $CO_x$ (carbon compounds) mixed with air or the like and which is heated to or above a temperature at which the cell body 20 begins to generate electric power (power generation start temperature), is introduced into the gas conduit 11 from outside of the electric power generation device 10. The power generation start temperature is, for example, 500° to 1000° Celsius.

The cell body 20 includes a solid oxide electrolyte 21, and fuel and air electrodes 22 and 23 joined to respective opposite surfaces of the electrolyte 21. To permit the electric power generated by the cell body 20 to be output to outside, a fuel electrode terminal 24 is joined to that surface of the fuel electrode 22 which is located opposite the solid oxide electrolyte 21, and also an air electrode terminal 25 is joined to that surface of the air electrode 23 which is located opposite the solid oxide electrolyte 21. The fuel and air electrode terminals 24 and 25 are connected, by respective electrical conductors 24a and 25a, to suitable equipment external to the gas conduit 11.

The solid oxide electrolyte 21 may be formed using, for example, 8 mol-YSZ (yttria-stabilized zirconia), 5 mol-YSZ, SDC (scandia-doped ceria), GDC (gadolinium-doped ceria), ScSZ (scandia-stabilized zirconia) or the like. The fuel electrode 22 may be formed using, for example, NiO+YSZ, NiO+SDC, NiO+GDC, LSCM (lanthanum strontium cobalt manganite), $FeO_3$ or the like. The air electrode 23 may be formed using, for example, LSM (lanthanum strontium manganite), LSC (lanthanum strontium cobaltite) or the like.

The secondary electric power generator 30 includes a P-type thermoelectric conversion member 31 and an N-type thermoelectric conversion member 32. The P- and N-type thermoelectric conversion members 31 and 32, both situated on the fuel electrode terminal 24, are joined together at their inner ends. The thus-joined P- and N-type thermoelectric conversion members 31 and 32 are connected via the fuel electrode terminal 24 to the fuel electrode 22 and serve as the high temperature-side junction of a thermocouple.

A P-type-converter electrode 31a is joined to the other end of the P-type thermoelectric conversion member 31 located outside of the gas conduit 11. Similarly, an N-type-converter electrode 32a is joined to the other end of the N-type thermoelectric conversion member 32 located outside of the gas conduit 11.

The P-type thermoelectric conversion member 31 may be formed using chromel, for example, and the N-type thermoelectric conversion member 32 may be formed using constantan, for example.

Operation of the electric power generation device 10 will be now described.

As the mixed fuel gas heated to the power generation start temperature or above is introduced from outside into the gas conduit 11 of the electric power generation device 10 in the left-to-right direction in FIG. 1, the cell body 20 is heated up to the power generation start temperature or higher and starts to act as a fuel cell.

Specifically, at the air electrode 23 of the heated cell body 20, oxygen ions ($O^{2-}$) are produced from the air contained in the mixed fuel gas. The oxygen ions move through the solid oxide electrolyte 21 to the fuel electrode 22, causing the cell body 20 to produce electric power. Also, the oxygen ions thus transferred to the fuel electrode 22 react with the $CH_x$ and $CO_x$ contained in the mixed fuel gas, forming carbon dioxide ($CO_2$) and water ($H_2O$). Besides, the P- and N-type thermoelectric conversion members 31 and 32 are heated by the thermal energy of the mixed fuel gas as well as by the heat of reaction generated at the fuel electrode 22, so that electric power is produced by the Seebeck effect.

In this manner, in the electric power generation device 10, electric power is produced not only by the single-chamber-type solid oxide fuel cell but also by the Seebeck effect, and thus, the electric power generation device 10 can generate electric power with high efficiency.

Heat of reaction is also generated at the air electrode 23. Accordingly, the secondary electric power generator may alternatively be joined to the air electrode 23 or to both of the fuel and air electrodes 22 and 23.

Figure 2:
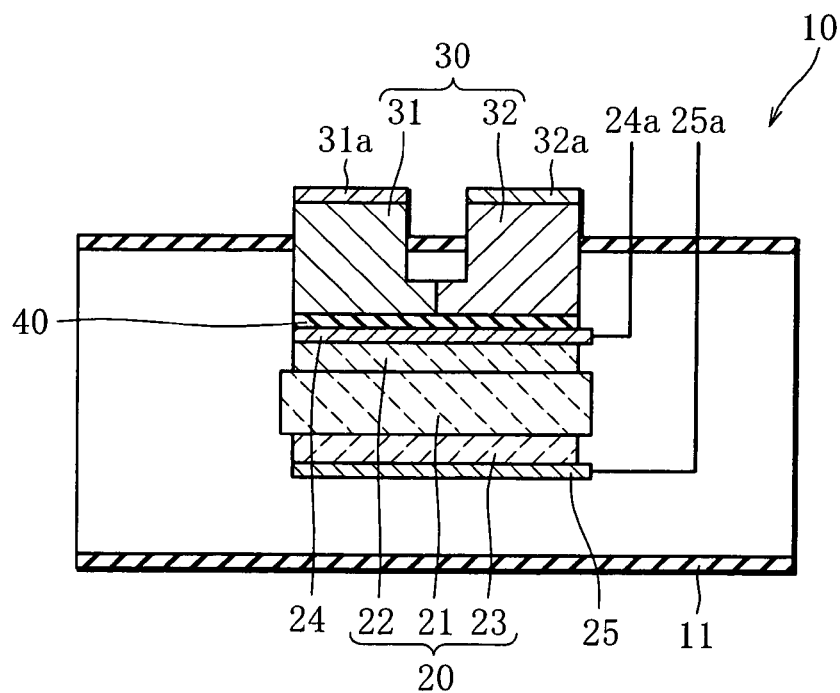
FIG. 2 A schematic sectional view of the electric power generation device of the first embodiment, wherein P- and N-type thermoelectric conversion members are joined to a fuel electrode with an electrically insulating layer therebetween.

Further, as shown in FIG. 2, the P- and N-type thermoelectric conversion members 31 and 32 constituting the secondary electric power generator 30 may be joined to either one or both of the fuel and air electrodes 22 and 23 with an electrically insulating layer 40 therebetween. Where the insulating layer 40 is provided, the secondary electric power generator 30 and the cell body 20 are electrically insulated from each other. Thus, by connecting the cell body 20 and the secondary electric power generator 30 suitably in series or parallel with each other, it is possible to derive a desired generation voltage.

Figure 3:
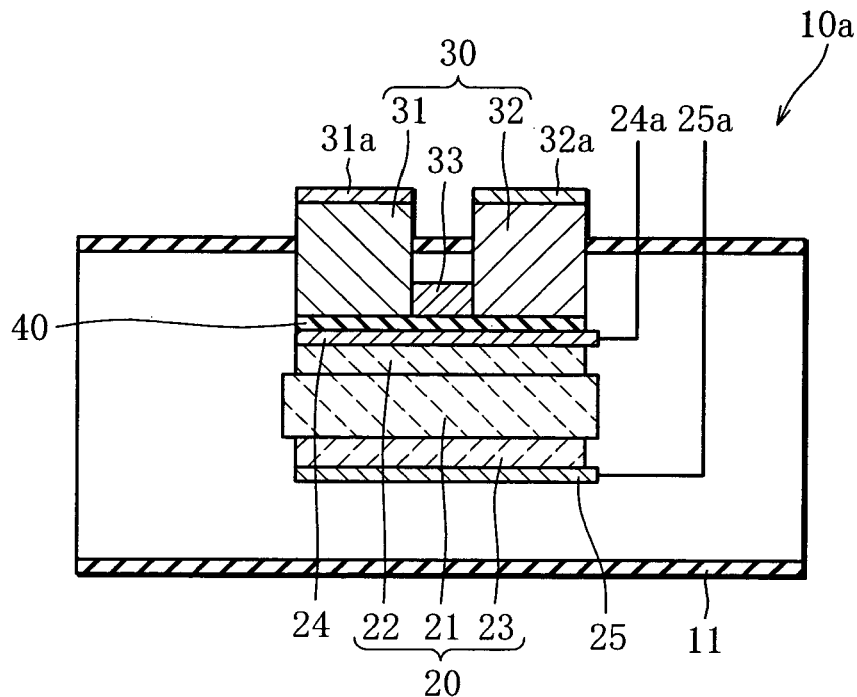
FIG. 3 A schematic sectional view of an electric power generation device according to a modification of the first embodiment.

FIG. 3 shows, in section, a schematic construction of an electric power generation device according to a modification of the first embodiment. In the figure, identical reference numerals are used to denote elements with identical functions already explained with reference to the first embodiment, and description of such elements is omitted.

In the electric power generation device 10a according to the modification, the P- and N-type thermoelectric conversion members 31 and 32 constituting the secondary electric power generator 30 are joined to the fuel electrode terminal 24 of the fuel electrode 22 with the insulating layer 40 therebetween. Also, the P- and N-type thermoelectric conversion members 31 and 32, both situated on the insulating layer 40, are spaced from each other and electrically connected to each other by an electrically conducting member 33 fitted in the space therebetween at the inner ends of the P- and N-type thermoelectric conversion members 31 and 32.

Thus, with the electric power generation device 10a, the P- and N-type thermoelectric conversion members 31 and 32 can be positioned at a distance from each other on the insulating layer 40. This permits the P- and N-type thermoelectric conversion members 31 and 32 to be arranged in positions where the heat of reaction generated by the cell body 20 can be efficiently utilized. Also, the P- and N-type thermoelectric conversion members 31 and 32 can be so located as to be able to efficiently absorb thermal energy from the mixed fuel gas flowing around the cell body 20. The electric power generation device 10a can therefore be further enhanced in electric power generation efficiency.

Second Embodiment

Figure 4:
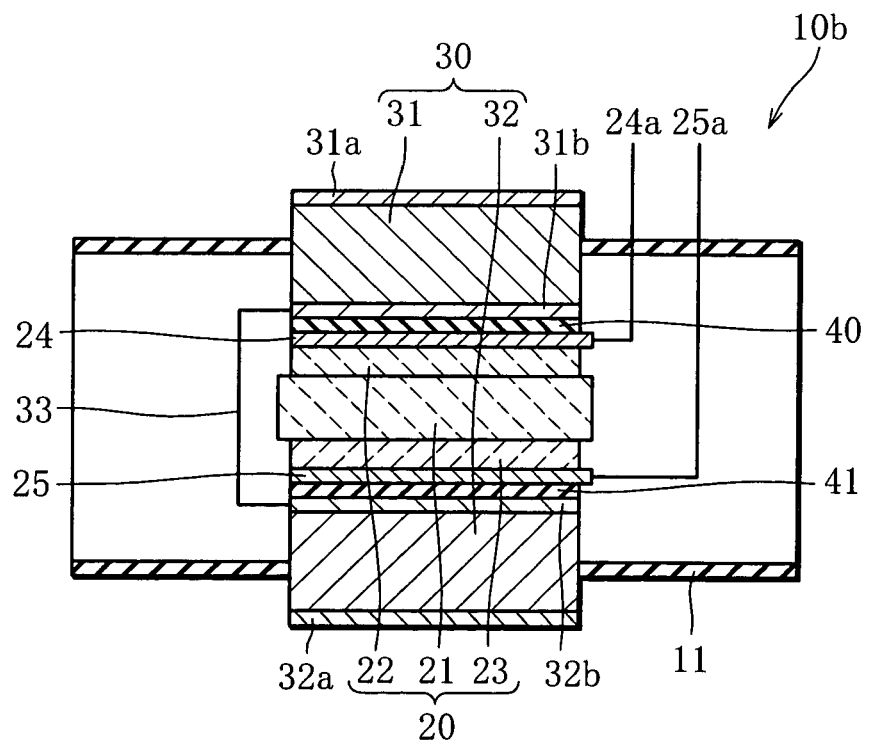
FIG. 4 A schematic sectional view of an electric power generation device according to a second embodiment of the present invention.

FIG. 4 shows, in section, a schematic construction of an electric power generation device according to a second embodiment of the present invention. In the figure, identical reference numerals are used to denote elements with identical functions already explained with reference to the foregoing embodiment, and description of such elements is omitted.

In the electric power generation device 10b of the second embodiment, the P-type thermoelectric conversion member 31 is joined to the fuel electrode terminal 24 of the fuel electrode 22 with the first insulating layer 40 therebetween, and the N-type thermoelectric conversion member 32 is joined to the air electrode terminal 25 of the air electrode 23 with a second insulating layer 41 therebetween. The P- and N-type thermoelectric conversion members 31 and 32 constitute the secondary electric power generator (secondary electric power generation means) 30.

A second P-type-converter electrode 31b, which is an electrode for the P-type thermoelectric conversion member 31, is formed on that surface of the P-type thermoelectric conversion member which faces the first insulating layer 40. Also, a second N-type-converter electrode 32b, which is an electrode for the N-type thermoelectric conversion member 32, is formed on that surface of the N-type thermoelectric conversion member which faces the second insulating layer 41. The second P-type-converter electrode 31b and the second N-type-converter electrode 32b are electrically connected to each other by the conducting member 33.

As the mixed fuel gas heated to the power generation start temperature or above is introduced from outside into the gas conduit 11 of the electric power generation device 10b, the fuel cell body (hereinafter referred to as cell body) 20 is heated up to the power generation start temperature or higher and begins to act as a fuel cell.

The P- and N-type thermoelectric conversion members 31 and 32 are heated by the thermal energy of the mixed fuel gas. In addition, the P-type thermoelectric conversion member 31 is heated by the heat of reaction generated at the fuel electrode 22, and the N-type thermoelectric conversion member 32 is heated by the heat of reaction generated at the air electrode 23, so that the efficiency of electric power generation by the Seebeck effect is further enhanced.

Thus, in the electric power generation device 10b, electric power is produced not only by the single-chamber-type solid oxide fuel cell but also by the Seebeck effect, whereby the electric power generation efficiency of the electric power generation device 10b can be enhanced even further.

Also, in the electric power generation device 10b, the secondary electric power generator 30 and the cell body 20 are electrically insulated from each other. Thus, by connecting the cell body 20 and the secondary electric power generator 30 suitably in series or parallel with each other, it is possible to derive a desired generation voltage.

Third Embodiment

Figure 5:
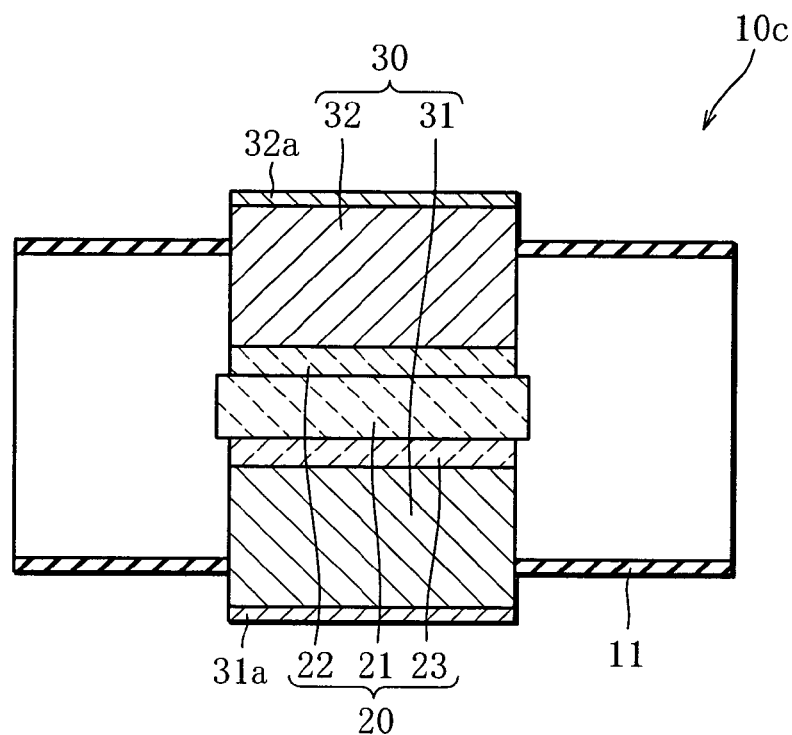
FIG. 5 A schematic sectional view of an electric power generation device according to a third embodiment of the present invention.

FIG. 5 shows, in section, a schematic construction of an electric power generation device according to a third embodiment of the present invention. In the figure, identical reference numerals are used to denote elements with identical functions already explained with reference to the foregoing embodiments, and description of such elements is omitted.

In the electric power generation device 10c of the third embodiment, the P-type thermoelectric conversion member 31 is joined directly to the air electrode 23, and the N-type thermoelectric conversion member 32 is also joined directly to the fuel electrode 22. The P- and N-type thermoelectric conversion members 31 and 32 constitute the secondary electric power generator (secondary electric power generation means) 30. The P- and N-type thermoelectric conversion members 31 and 32 constituting the secondary electric power generator 30 are electrically connected to each other by the fuel cell body (hereinafter referred to as cell body) 20.

As the mixed fuel gas heated to the power generation start temperature or above is introduced from outside into the gas conduit 11 of the electric power generation device 10c, the cell body 20 is heated up to the power generation start temperature or higher and acts as a fuel cell.

The P- and N-type thermoelectric conversion members 31 and 32 are heated by the thermal energy of the mixed fuel gas. In addition, the P-type thermoelectric conversion member 31 is heated by the heat of reaction generated at the air electrode 23, and the N-type thermoelectric conversion member 32 is heated by the heat of reaction generated at the fuel electrode 22. Consequently, the P- and N-type thermoelectric conversion members 31 and 32 constituting the secondary electric power generator 30 generate electric power by making use of the Seebeck effect.

Thus, in the electric power generation device 10c, electric power is efficiently produced not only by the single-chamber-type solid oxide fuel cell but also by the Seebeck effect, whereby the electric power generation efficiency of the electric power generation device 10c can be still further enhanced.

Also, in the electric power generation device 10c, the P- and N-type thermoelectric conversion members 31 and 32 of the secondary electric power generator 30 are electrically connected to each other by the cell body 20, and thus the cell body 20 and the secondary electric power generator 30 are electrically connected in series with each other. Accordingly, the sum of the voltage generated by the cell body 20 and that generated by the secondary electric power generator 30 appears between the first P-type-converter electrode 31a and the first N-type-converter electrode 32a.

Fourth Embodiment

Figure 6:
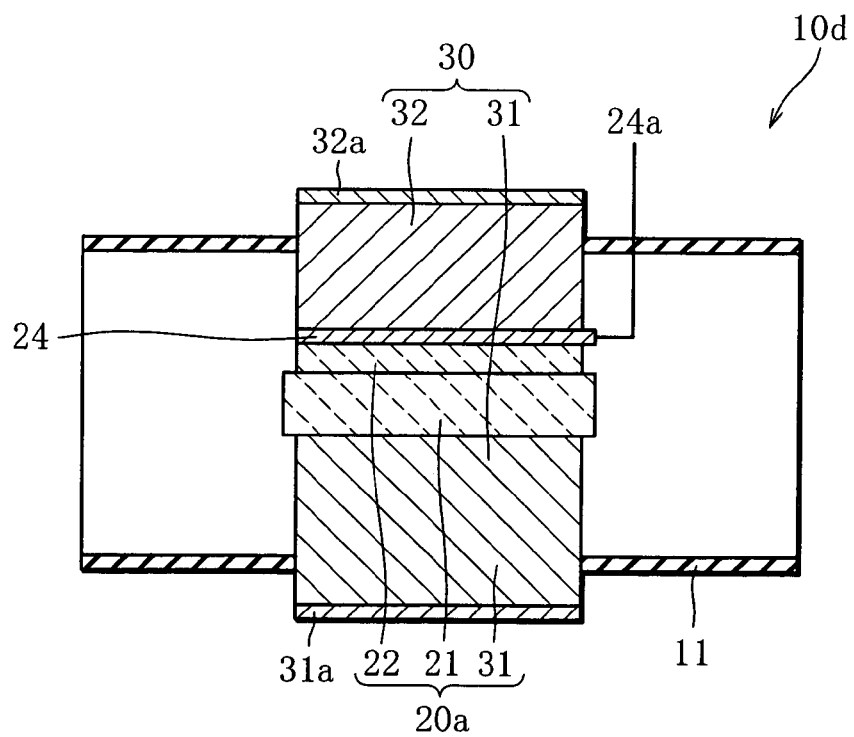
FIG. 6 A schematic sectional view of an electric power generation device according to a fourth embodiment of the present invention.

FIG. 6 shows, in section, a schematic construction of an electric power generation device according to a fourth embodiment of the present invention. In the figure, identical reference numerals are used to denote elements with identical functions already explained with reference to the foregoing embodiments, and description of such elements is omitted.

The electric power generation device 10d of the fourth embodiment includes a fuel cell body (hereinafter referred to as cell body) 20a, wherein the fuel electrode 22 is joined to one surface of the solid oxide electrolyte 21. The N-type thermoelectric conversion member 32 is joined to the fuel electrode 22 with the fuel electrode terminal 24 therebetween. The P-type thermoelectric conversion member 31, which functions also as an air electrode, is joined to the other surface of the solid oxide electrolyte 21. Namely, the cell body 20a is constituted by the solid oxide electrolyte 21, the fuel electrode 22, and the P-type thermoelectric conversion member 31 serving also as an air electrode. The P- and N-type thermoelectric conversion members 31 and 32, which constitute the secondary electric power generator (secondary electric power generation means) 30, are electrically connected to each other by the solid oxide electrolyte 21, the fuel electrode 22, and the fuel electrode terminal 24.

As the mixed fuel gas heated to the power generation start temperature or above is introduced from outside into the gas conduit 11 of the electric power generation device 10d, the cell body 20a is heated up to the electric power generation initiation temperature or higher and acts as a fuel cell.

The P- and N-type thermoelectric conversion members 31 and 32 are heated by the thermal energy of the mixed fuel gas. At this time, the P-type thermoelectric conversion member 31 reacts as the air electrode and thus is heated by the heat of reaction. Consequently, the P- and N-type thermoelectric conversion members 31 and 32 constituting the secondary electric power generator 30 generate electric power by making use of the Seebeck effect.

Thus, in the electric power generation device 10d, electric power is produced not only by the single-chamber-type solid oxide fuel cell but also by the Seebeck effect, whereby the electric power generation efficiency of the electric power generation device 10d can be enhanced. Also, in the electric power generation device 10d of this embodiment, the P-type thermoelectric conversion member 31 reacts as an air electrode, and therefore, the heat of reaction can be more efficiently utilized for generating electric power.

Figure 7:
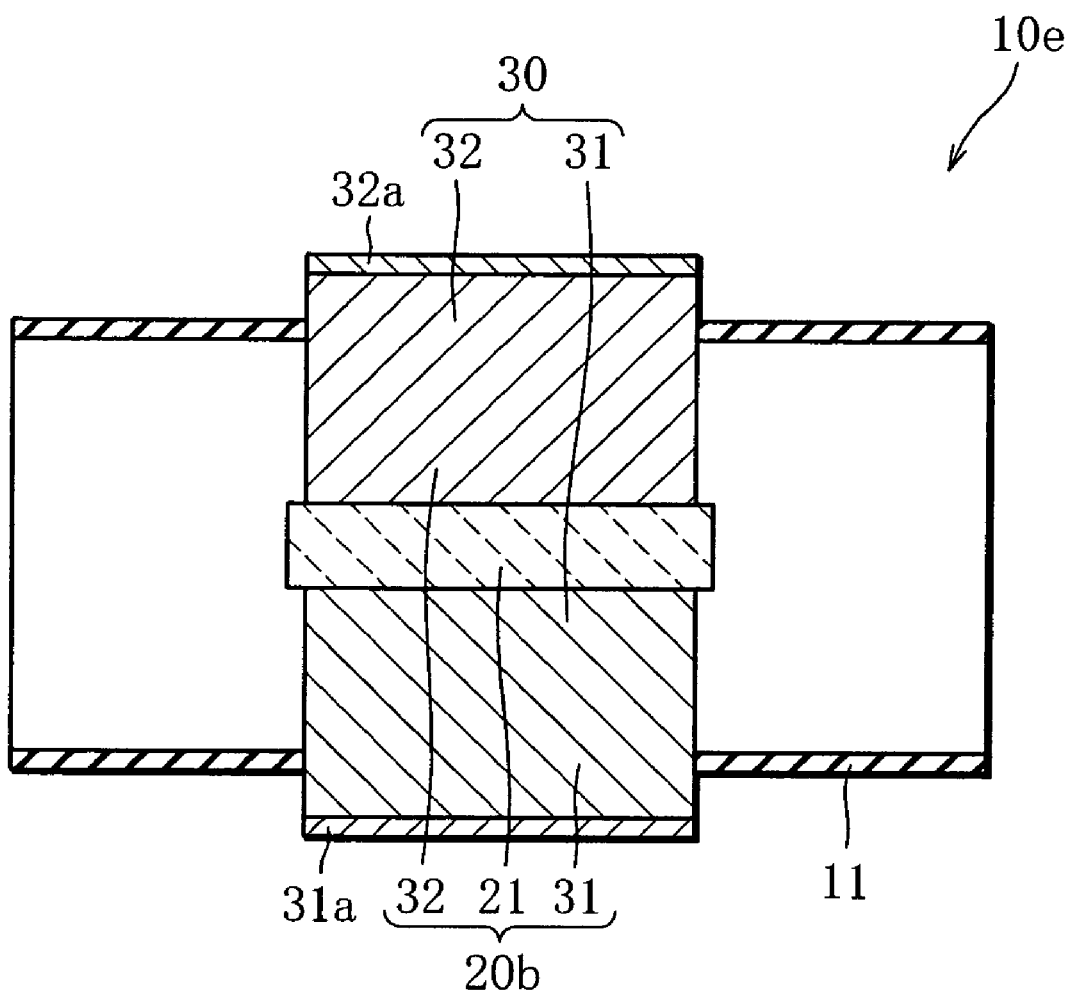
FIG. 7 A schematic sectional view of an electric power generation device according to a modification of the fourth embodiment.

FIG. 7 shows, in section, a schematic construction of an electric power generation device according to a modification of the fourth embodiment. In the figure, identical reference numerals are used to denote elements with identical functions already explained with reference to the foregoing embodiments, and description of such elements is omitted.

The electric power generation device 10e includes a fuel cell body (hereinafter referred to as cell body) 20b, wherein the N-type thermoelectric conversion member 32, which functions also as a fuel electrode, is joined to one surface of the solid oxide electrolyte 21, and the P-type thermoelectric conversion member 31, which functions also as an air electrode, is joined to the other surface of the solid oxide electrolyte 21. Namely, the cell body 20b is constituted by the solid oxide electrolyte 21, the P-type thermoelectric conversion member 31 serving also as an air electrode, and the N-type thermoelectric conversion member 32 serving also as a fuel electrode. The N- and P-type thermoelectric conversion members 32 and 31, which constitute the secondary electric power generator (secondary electric power generation means) 30, are electrically connected to each other by the solid oxide electrolyte 21.

As the mixed fuel gas heated to the power generation start temperature or above is introduced from outside into the gas conduit 11 of the electric power generation device 10e, the cell body 20b is heated up to the power generation start temperature or higher and acts as a fuel cell. The P- and N-type thermoelectric conversion members 31 and 32 are individually heated by the thermal energy of the mixed fuel gas as well as by the heat of reaction of the fuel cell. Consequently, the P- and N-type thermoelectric conversion members 31 and 32 constituting the secondary electric power generator 30 generate electric power by making use of the Seebeck effect. Thus, the P- and N-type thermoelectric conversion members 31 and 32 are directly heated by the heat of reaction, and therefore, the electric power generation efficiency of the electric power generation device 10e is enhanced even further.

While the electric power generation devices according to the preferred embodiments of the present invention have been described, it is to be noted that the present invention is not limited to the foregoing embodiments alone.

The electrolyte to be used in the electric power generation device of the present invention is not limited to the solid oxide electrolyte, and the present invention can be applied to any type of fuel cell insofar as the fuel cell has a cell body and the fuel and air electrodes of the cell body can make use of the heat of reaction. Also, the type of fuel cell with a cell body is not limited only to the single-chamber-type fuel cell. Further, the electric power generation device of the present invention may include a plurality of fuel cell bodies.

Also, as the mixed fuel gas, a combustion exhaust gas emitted from an internal or external combustion engine with a temperature higher than or equal to the power generation start temperature may be used so that the fuel cell body can be heated by the high-temperature combustion exhaust gas to produce electric power. Since the secondary electric power generator can produce electric power by utilizing the thermal energy of the combustion exhaust gas as well as the heat of reaction generated by one or both of the fuel and air electrodes, the electric power generation efficiency can be improved. Moreover, hydrocarbon compounds ($CH_x$) and carbon oxides ($CO_x$) contained in the combustion exhaust gas are converted into carbon dioxide ($CO_2$) and water ($H_2O$), whereby the combustion exhaust gas can be purified. Thus, where the electric power generation device of the present invention is applied to automobiles or the like, electric power can be generated using the combustion exhaust gas, improving the fuel efficiency and also making it possible to purify the combustion exhaust gas.

The invention claimed is:

1. An electric power generation device comprising:
   a cell body having an electrolyte, a fuel electrode and an air electrode; and
   secondary electric power generation means joined to at least one of the fuel electrode and the air electrode, and including a P-type thermoelectric conversion member and an N-type thermoelectric conversion member;
   wherein the N-type thermoelectric conversion member is joined only to the fuel electrode among the fuel electrode and the air electrode of the cell body, and the P-type thermoelectric conversion member is joined only to the air electrode among the fuel electrode and the air electrode of the cell body.

2. The electric power generation device according to claim 1, wherein the cell body constitutes part of a solid oxide fuel cell.

* * * * *